(12) United States Patent
Olson

(10) Patent No.: US 6,507,210 B1
(45) Date of Patent: Jan. 14, 2003

(54) SYSTEM AND METHOD FOR POWER TESTING A CHASSIS

(75) Inventor: Philip D. Olson, Kenwood, CA (US)

(73) Assignee: Ulysses ESD, Inc., San Jose, CA (US)

( * ) Notice: Subject to any disclaimer, the term of this patent is extended or adjusted under 35 U.S.C. 154(b) by 36 days.

(21) Appl. No.: 09/721,346

(22) Filed: Nov. 22, 2000

(51) Int. Cl.$^7$ .............................................. G01R 31/36
(52) U.S. Cl. ...................................... 324/771; 702/122
(58) Field of Search ................................ 324/771, 772, 324/158.1, 765, 427, 761, 763, 117 R; 361/600, 720, 731, 736, 788; 710/300, 301; 702/119, 122, 123, 126; 340/653, 660; 714/22

(56) References Cited

U.S. PATENT DOCUMENTS

| | | | | |
|---|---|---|---|---|
| 5,303,121 A | * | 4/1994 | Thornberg | 361/760 |
| 5,365,453 A | * | 11/1994 | Startup et al. | 320/136 |
| 5,867,809 A | * | 2/1999 | Soga et al. | 340/588 |
| 5,894,408 A | * | 4/1999 | Stark et al. | 361/600 |
| 6,035,265 A | * | 3/2000 | Dister et al. | 324/772 |
| 6,088,224 A | * | 7/2000 | Gallagher et al. | 361/695 |
| 6,137,280 A | * | 10/2000 | Ackermann et al. | 323/224 |
| 6,259,254 B1 | * | 7/2001 | Klang | 324/427 |
| 6,261,249 B1 | * | 7/2001 | Talish et al. | 600/459 |

\* cited by examiner

Primary Examiner—Michael Sherry
Assistant Examiner—Minh N. Tang
(74) Attorney, Agent, or Firm—Gary S. Williams; Pennie & Edmonds LLP

(57) ABSTRACT

A load test board is configured for plugging into a backplane of a chassis. The load test board has a CPU, a variable load controlled by the CPU, a voltage sensor to detect voltage across the variable load, and a current sensor to detect current through the variable load. To test the chassis, one or more of the load text boards are plugged into the backplane of the chassis. Each load test board provides a variable load, using circuitry on the test board to control the variable load, and measures current through the variable load and voltage across the variable load. Information corresponding to the measurements is conveyed to a host computer.

23 Claims, 3 Drawing Sheets

SYSTEM AND METHOD FOR POWER TESTING A CHASSIS

The present invention relates generally to systems, and particularly to power testing a system chassis.

BACKGROUND OF THE INVENTION

The present invention is an improvement of the existing method of power testing a system chassis. It is desirable to measure the power characteristics of a system chassis under the conditions of actual use. For example, it is useful to correlate the amount of power consumed by the chassis during operation with the temperature inside the chassis. Also, it is desirable to test the maximum power under which the chassis can operate. Thus, what is needed is an apparatus and method for testing a computer chassis under operating conditions.

A computer system is generally contained in a chassis. A chassis is typically made up of a housing and a backplane. A power supply may be located either outside the chassis or within the chassis. Within the chassis, computer devices or computer circuit boards are plugged into the backplane. A controller or host controls these computer devices through the backplane. In addition, a fan may be housed within the chassis to cool the system.

In order to accurately test the power characteristics of a system chassis, it is necessary to simulate operating conditions. One method of measuring the power characteristics of a chassis consists of attaching a load generator to the system's power supply. However, because the load generator is not plugged into the backplane inside the chassis, it is not a true test of the system under operating conditions. Moreover, because the load generator is not inside the chassis, it is impossible to provide a thermal or cooling analysis of the chassis. Another method of testing the chassis is to plug resistor load boards into the backplane of the chassis. However, in order to change the operating conditions of the system it is necessary to physically change the load boards. Thus, using this method, it is impossible to test the power characteristics under dynamic operating conditions.

SUMMARY OF THE INVENTION

In summary, the present invention is a load test board for plugging into a backplane of a chassis. The load test board has a CPU, a variable load controlled by the CPU, a voltage sensor to detect voltage across the variable load, and a current sensor to detect current through the variable load.

Another aspect of the present invention is a chassis having a backplane and a load test board plugged into the backplane. The load test board has a CPU, a variable load controlled by the CPU, a voltage sensor to detect voltage across the variable load, and a current sensor to detect current through the variable load.

Yet another aspect of the present invention is a method of testing a chassis including inserting a test board into a backplane of the chassis, providing a variable load on the test board, using circuitry on the test board to control the variable load, and measuring current through the variable load and voltage across the variable load.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENTS

Figure 1:
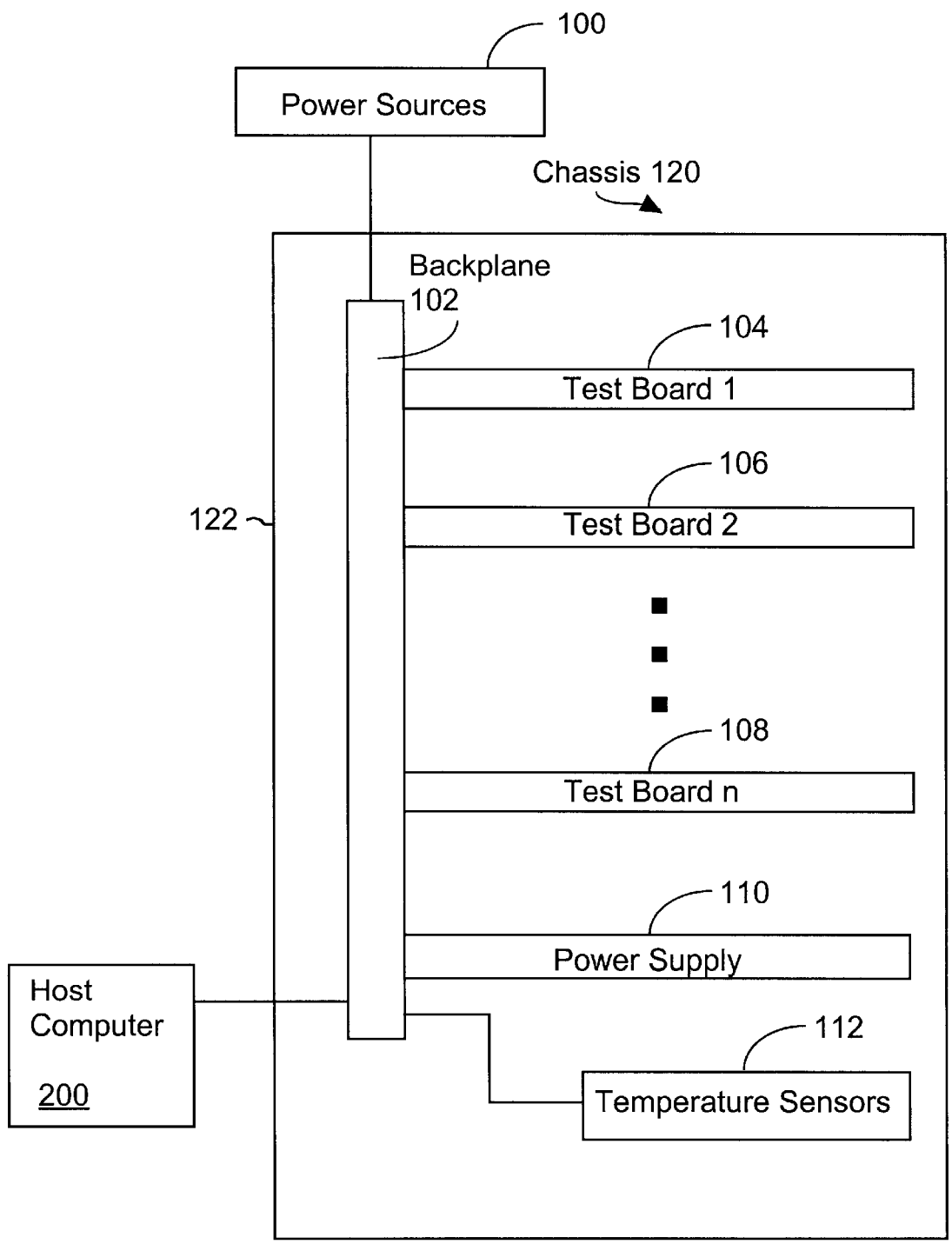
FIG. 1 is an illustration of a chassis in accordance with the present invention.

Referring to FIG. 1, there is shown a chassis 120 having a housing 122 and a backplane 102. The chassis is powered by power sources 100. In order to test the power characteristics of the chassis 120, load test boards 104–108 are inserted into the backplane 102. The number of load test boards 104–108 will vary depending upon the system that is being simulated. A host computer 200 communicates with the load test boards through the backplane 102. The operation of the load test boards 104–108 may be adjusted by the host computer in order to simulate operating activity of the chassis 120. The load test boards 104–108 send information to the host computer regarding the power absorbed by the chassis. In this way, it is possible to determine the maximum amount of power that may be used by the chassis. One or more temperature sensors 112 may be used to correlate the absorbed power with the temperature inside the chassis 120. The temperature sensors 112 may be incorporated into the chassis, or may be located on a separate daughter board from the load test boards, or may even be located on the load test boards. In alternate embodiments, a power supply 110 may be located inside the chassis 120.

Figure 2:
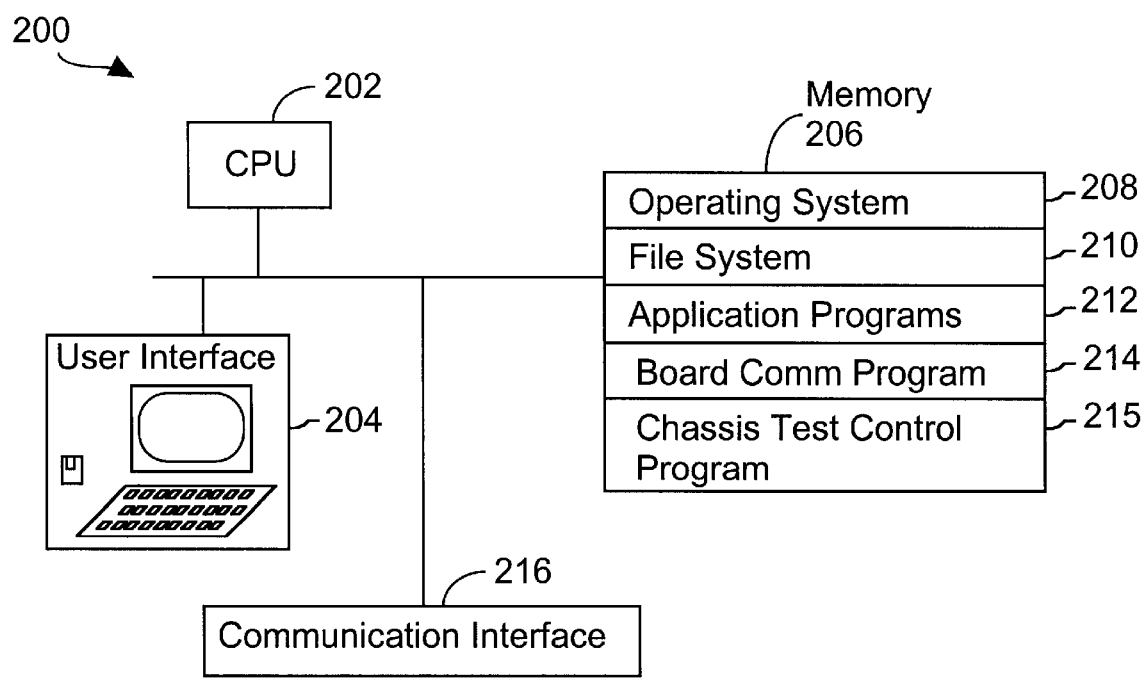
FIG. 2 is an illustration of a host computer in accordance with the present invention.

As shown in FIG. 2, the host computer 200 includes one or more CPU's 202, a user interface 204, a communication interface 216, and memory 206. The operation of the host computer 200 is controlled by control programs executed by the CPU 202. In a typical implementation, the programs and data structures in memory 206 include an operating system 208, a file system 210, application programs 212, and a board communication program 214. The board communication program 214 responds to input from a user, or commands from a chassis test control program 215, and sends commands to the chassis system via the communication interface 216. That is, a chassis test control program 215 may be used to automatically send a sequence of commands to the test boards in a chassis system so as to automatically test the chassis at a sequence of loads. Alternately, or in addition, user specified load values may be communicated to the test boards by the board communication program 214 in response to user commands.

The board communication program 214 also receives information from the chassis system via the communication interface 216. The chassis system may include more than one load test board, and the commands sent to the chassis system by the host computer 200 may either be broadcast to all the load test boards in the system, or may be directed to specific ones of the load test boards. To allow commands to be sent to a specified load test board, each load test board may be assigned a unique address. In various embodiments that address may be determined by circuitry on the load test board, by a value stored in the memory of the load test board, or based on the backplane slot in which the load test board has been mounted.

Figure 3:
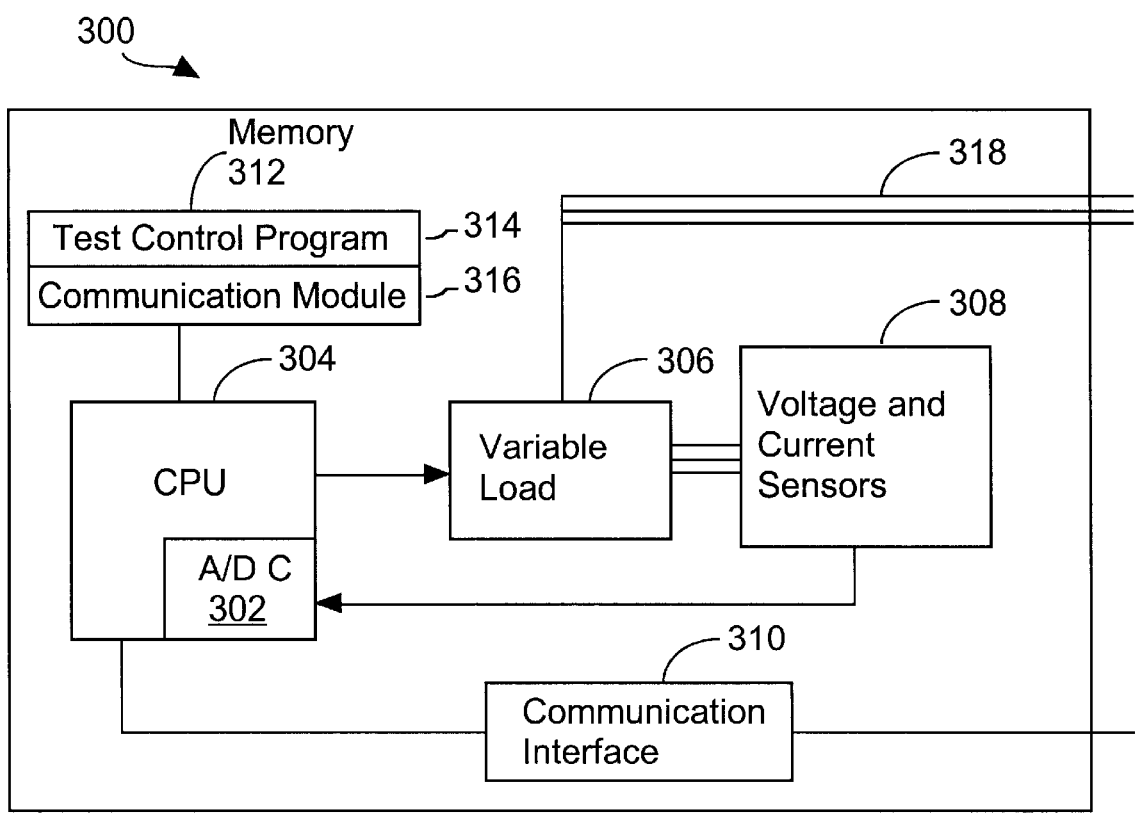
FIG. 3 is an illustration of a test board in accordance with the present invention.

FIG. 3 shows a load test board 300 in accordance with the present invention. The test board plugs into the backplane of a chassis. The test board communicates with the host computer through the backplane of the chassis via the communication interface 310. The variable load 306 is an electronic load which is controlled by the CPU 304. In the preferred embodiment, the CPU executes a test control program 314 that is stored in memory 312. The test control program 314 responds to commands received from the host computer, via the communication interface 310, to control the variable load 306. The CPU 304 controls the actual load presented by variable load 306 to the chassis by varying the bias on a field effect transistor (FET) within the variable load 306. A test point may be added to directly measure the voltage across the load resistors of the FET for verification. The variable load 306 is coupled to the power supply or supplies of the chassis by a bus 318.

Voltage and current sensors 308 measure the voltage across the variable load 306 and the load current. The CPU 304, in the preferred embodiment, contains an analog to digital converter 302 that converts the analog signals received from the voltage and current sensors 308 to digital signals to be processed by the CPU 304. The CPU executes a communication module 316 to send the testing information to a host computer via the communication interface 310. In some embodiments, the absorbed power may be determined by the communication module 316, while in other embodiments the host computer may make the determination from the testing information.

Alternate Embodiments

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. Test apparatus comprising:
    a load test board configured for plugging into a backplane of a chassis; the load test board including:
      a CPU;
      a variable load controlled by the CPU;
      a voltage sensor to detect voltage across the variable load; and
      a current sensor to detect current through the variable load.

2. The test apparatus of claim 1 further including a control program, executed by the CPU, for setting the variable load in response to commands from a host computer.

3. The test apparatus of claim 1 further including a communication interface for receiving commands from a host computer and for sending testing information to the host computer.

4. The test apparatus of claim 3 wherein the CPU includes an analog to digital converter coupled to the voltage and current sensors for converting input analog signals into digital signals.

5. The test apparatus of claim 4 wherein
    the analog to digital converter converts input analog signals from the voltage and current sensors into digital signals representing voltage and current measurements; and
    the CPU executes a control program that responds to the received commands by setting the variable load in response to the received commands and that generates messages including information corresponding to the digital signals representing voltage and current measurements and sending the generated messages to the host computer via the communication interface.

6. A chassis comprising:
    a backplane;
    a load test board plugged into the backplane, comprising:
      a CPU;
      a variable load controlled by the CPU
      a voltage sensor to detect voltage across the variable load; and
      a current sensor to detect current through the variable load.

7. The chassis of claim 6, wherein the backplane is coupled to a host computer.

8. The chassis of claim 6, wherein the load test board further includes a control program, executed by the CPU, for setting the variable load in response to commands from a host computer.

9. The chassis of claim 8, wherein the load test board further includes a communication interface for receiving commands from the host computer and for sending testing information to the host computer.

10. The chassis of claim 9, wherein the CPU of the load test board includes an analog to digital converter coupled to the voltage and current sensors for converting input analog signals into digital signals.

11. The chassis of claim 10 wherein
    the analog to digital converter converts input analog signals from the voltage and current sensors into digital signals representing voltage and current measurements; and
    the control program executed by the CPU generates messages including information corresponding to the digital signals representing voltage and current measurements and sending the generated messages to the host computer via the communication interface.

12. The chassis of claim 10, wherein the load test board comprises a plurality of load test boards, each load test board of the plurality of load test boards comprising:
    a CPU;
    a variable load controlled by the CPU;
    a voltage sensor to detect voltage across the variable load; and
    a current sensor to detect current through the variable.

13. The chassis of claim 12, wherein each load test board of a subset of the plurality of load test boards further includes a control program, executed by the CPU of the load test board, for setting the variable load in response to commands from a host computer.

14. The chassis of claim 13, wherein each load test board of the subset of the plurality of load test boards further includes a communication interface for receiving commands from the host computer and for sending testing information to the host computer.

15. The chassis of claim 14, wherein the CPU of each load test board of the subset of the plurality of load test boards includes an analog to digital converter coupled to the voltage and current sensors for converting input analog signals into digital signals.

16. The chassis of claim 13 wherein
    the analog to digital converter of each load test board of the subset of the plurality of load test boards converts input analog signals from the voltage and current sensors into digital signals representing voltage and current measurements; and
    the control program executed by the CPU of each load test board generates messages including information corresponding to the digital signals representing voltage and current measurements and sending the generated messages to the host computer via the communication interface.

17. The chassis of claim 16, further including a temperature sensor operatively coupled to the host computer to enable the host computer to correlate absorbed power with temperature in the chassis.

18. The chassis of claim 13, further including a temperature sensor operatively coupled to the host computer to enable the host computer to correlate absorbed power with temperature in the chassis.

19. The chassis of claim 7, further including a temperature sensor operatively coupled to the host computer to enable the host computer to correlate absorbed power with temperature in the chassis.

20. A method of testing a chassis comprising the steps of:
    inserting a test board into a backplane of the chassis;
    providing a variable load on the test board;
    using circuitry on the test board to control the variable load; and
    measuring current through the variable load and voltage across the variable load.

21. The method of claim 20 wherein the using step includes executing a control program, using a CPU on the test board, to set the variable load in response to commands from a host computer.

22. The method claim 20 further including the step of receiving commands from a host computer and sending testing information to the host computer corresponding to measurements generated by the measuring step.

23. The method claim 20 further including converting voltage and current measurements generated by the measuring step into digital values, and sending information to a host computer corresponding to the digital values.

* * * * *